United States Patent [19]
Place

[11] 3,992,092
[45] Nov. 16, 1976

[54] MICROFILM INSTRUCTION SYSTEM

[75] Inventor: Harry Place, Ridgewood, N.J.

[73] Assignee: International Telephone and Telegraph Corporation, Nutley, N.J.

[22] Filed: Feb. 21, 1975

[21] Appl. No.: 551,886

[52] U.S. Cl. ................................. 355/41; 35/9 A; 353/26 A; 355/45; 355/52
[51] Int. Cl.² .................. G03B 27/52; G09B 3/00; G09B 7/00
[58] Field of Search ............ 355/41, 45, 52; 353/25, 353/26; 35/9 R, 9 A, 9 E

[56] References Cited
UNITED STATES PATENTS

| | | | |
|---|---|---|---|
| 3,165,969 | 1/1965 | Gunn | 355/52 X |
| 3,605,284 | 9/1971 | Kay | 35/9 A |
| 3,608,208 | 9/1971 | Willardson | 35/9 A |
| 3,628,255 | 12/1971 | Golden | 35/9 E |
| 3,629,956 | 12/1971 | Thomas et al. | 35/9 A |
| 3,733,717 | 5/1973 | Montgomery et al. | 35/9 A |
| 3,757,091 | 9/1973 | Baker | 353/26 A X |
| 3,798,793 | 3/1974 | Kachi | 35/9 A |
| 3,810,317 | 5/1974 | Rosenbaum et al. | 35/9 A |

*Primary Examiner*—Richard A. Wintercorn
*Attorney, Agent, or Firm*—John T. O'Halloran; Alfred C. Hill

[57] ABSTRACT

A microfilm instruction system provides detailed service instructions for diagnosing and repairing complex electronic instrumentation. Troubleshooting procedures are recorded on microfilm along with a series of programmed instructions for directing the service repairman step-by-step to pinpoint the source of the problem and to make the necessary repair. Each frame of microfilm containing a sequence of question sets which appear upon the display plate of the microfilm viewing system further provides a corresponding series of response switches also located on the microfilm viewing system. Each of the questions relate to a possible condition for the malfunctioning electronic apparatus to be repaired and each series of questions requires an affirmative or negative response by means of the response switches. Each frame of microfilm also has a series of optically encoded information data which when electrically read, automatically directs the operator to the next relevant frame in the course of the diagnostic and repair sequence. The response switches in connection with a gated electronic circuit cooperate with the optically encoded information by means of a photoelectric matrix array to show the next frame in the series by means of a digital readout display. Operation of a start control switch causes a motor drive to automatically advance so that the repairman is now presented with a set of new questions in order to proceed with the diagnostic schedule. The repairman now answers the new set of data questions and pushes corresponding response switches in reply. While this invention primarily describes automatic motor driven advance to provide rapid access to new information, the use of a manual frame advance in response to the digital readout is not precluded. The aforementioned combination of photodetectors, gate circuits and microfilm optically encoded data then direct the repairman to further frames if further diagnosis is necessary. After a required number of frames have been presented and the reponse via the coded data and gate circuit combination indicate to the technician that repair, for example, includes a part replacement then the next frame to be presented will be the frame that includes the part number and the location of the part to be replaced in a storage area containing all the replacement parts for the particular apparatus involved. One microfilm viewing cassette of the aforementioned design therefore is able to provide diagnosis and repair for a large number of sophisticated electronic apparatus by means of an equivalent number of reels of microfilm frames.

8 Claims, 9 Drawing Figures

MICROFILM INSTRUCTION SYSTEM

BACKGROUND OF THE INVENTION

With the advancing state-of-the-art of electronic equipment for defense including communications, counter-measures and navigational equipment the trend has been to package very complex equipment in small packages. One example of a limited space area containing a large quantity of such complex electronic apparatus is within a submarine where space requirements are a minimum and a large number of electronic control communications and counter-measure apparatus must be provided. Each instrument in order to assure proper functioning and repair must contain its own instruction manual for providing circuit schematics of the electronics involved and cataloging and describing replacement parts. In view of the large number of manuals involved the trend has been towards miniaturization by reducing the information within the manuals to microfilm and replacing the manuals involved with a mobile microfilm viewing device. In this manner a large amount of information can be stored on a relatively small number of microfilm reels. When any of the apparatus requires servicing then the repairman takes the corresponding reel of microfilm and inserts it within the microfilm viewer for presenting the series of diagnostic steps and repair suggestions contained within the film. After sequentially performing the suggested measurements to determine which of the electronic elements are defective or inoperative then the repairman is able to dial the microfilm viewer to the section of the film reel which deals with part description and procurement. This portion of the film instructs the repairman as to the name of the part requiring replacement and also directs him to the exact location of this part in a particular bin within a parts storage area.

Although the level of sophistication for military type electronic apparatus has substantially advanced over the past few years the skill of the military repairman has remained relatively level over the same period of time. The advent of the microfilm method for diagnosing and repairing electronic instrumentation therefore is necessary not only in view of the space limitations but also in view of the complexity of the circuitry involved. Another factor present in the repair of submarine instrumentation for example is the time requirement particularly when the submarine navigational or communications systems are involved. The instrumentation in most instances requires immediate diagnosis and repair in order to meet military preparedness requirements and to assure vital information is not missed in the event of emergency situations due to long repair down times involving communications apparatus.

The purpose of this invention therefore is to describe a microfilm instruction system that provides rapid and automatic diagnostic facilities for complex electronic instrumentation so that maintenance and repair can be accomplished in the least possible time. The microfilm instruction system also finds application in the educational field in view of the interrelationship generated between the system of interrogation by the film program and the instructional feedback from the system to the operator.

SUMMARY OF THE INVENTION

This invention comprises a microfilm instruction system consisting of a plurality of microfilm frames containing a number of programmed questions which require a corresponding number of answers. The individual frames further include a number of optically encoded pieces of data where the data is programmed to direct the microfilm frames to a sequence of frames, either manually or automatically, based on the nature of the answers to the questions presented upon the face of the microfilm frame. The microfilm system further includes a microfilm viewing console where the questions are projected upon a viewing screen and a plurality of response switches where the questions are answered by the operator by means of depressing one or several of the response switches. The microfilm console further includes a plurality of photoresponsive elements in a matrix array so that the same projection system used for illuminating the microfilm upon the microfilm viewing plate also projects light energy through that portion of the microfilm which contains the optically encoded data. The next frame in the sequence is thereby selected by means of a logic circuit, a shaft encoder and a motorized drive mechanism. The response switches selected in answer to the questions displayed upon the microfilm viewing screen provide electrical signals to the gates within a logic circuit which simultaneously combines the electrical signals in response to the excitation of the photoelectric array within the microfilm chassis. The resultant signal then activates a motorized drive mechanism to advance the microfilm to the required frame. A digital readout provided on the face of the microfilm console also connected to the electrical signal from the aforementioned logic circuit visually indicates the number of the frame next being displayed. Questions are again presented on the microfilm viewing screen and response switches are activated after the operator has possibly performed the tests and measurements prescribed and a new frame is now selected by means of the interaction between the coded data on the film, the logic circuit and the photoelectric array.

DESCRIPTION OF THE PREFERRED EMBODIMENT

Figure 4:
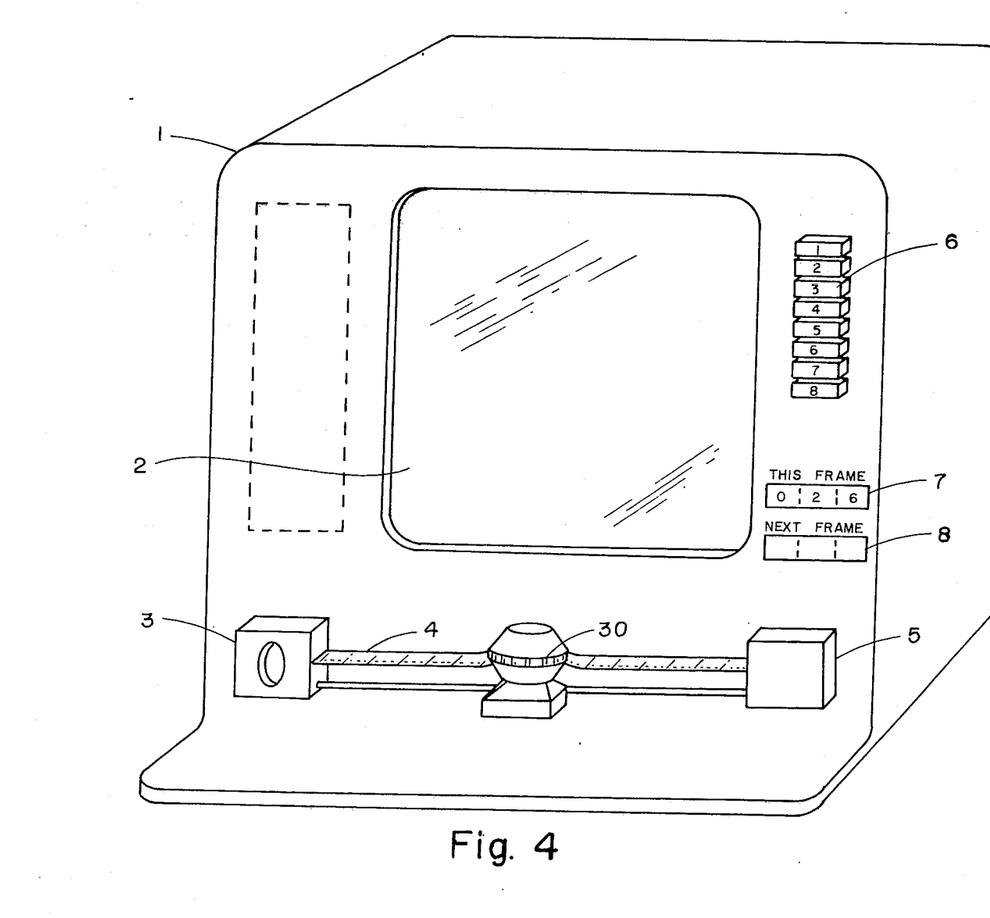
FIG. 4 is a front perspective view of a console housing the microfilm instruction system of this invention.

The complete microfilm instruction console of this invention can be seen by referring to FIG. 4. Here the console 1 has a large viewing screen 2, a microfilm cassette 3 and a motor driven takeup reel 5. The microfilm 4 is focused upon the viewing screen 2 by the standard optical focus adjustment 30. The inventive microfilm system differs from ordinary microfilm procedures by the inclusion of response switches 6 and digital readout indicators 8. The purpose of the response switches 6 is to allow the operator to answer certain programmed questions that are projected upon the viewing screen 2. When the viewer has depressed one or more of the response switches 6 then by means of a complex electro-optical system and specially prepared encoded microfilm the system automatically indicates the next frame to be selected on the second digital readout indicator 8 and automatically presents the next sheet of information upon the viewing screen 2.

The question and answer feedback relationship between the operator and the information selected upon the viewing screen readily provides a diagnostic and tutorial function when the inventive microfilm system is employed with a suitable reel of programmed and encoded film.

Figure 1:
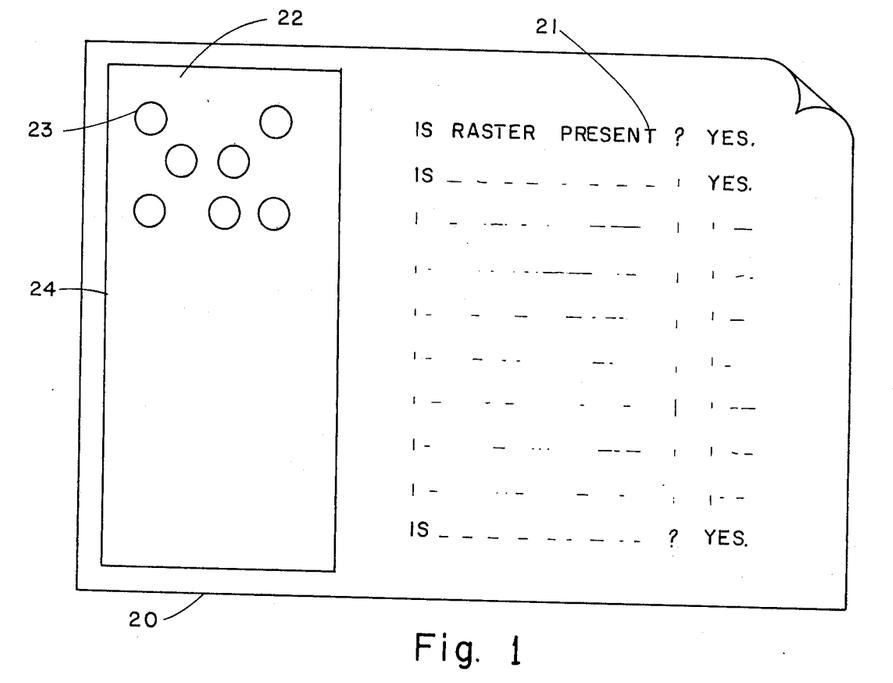
FIG. 1 is a front view of a data sheet including information to be filmed and binary data to be optically encoded.

One embodiment for using the inventive system as a diagnostic device would be that of troubleshooting a television receiver. A repair manual for the receiver is prepared in the form of a number of selected questions that when answered indicate the next series of questions that should be answered and when a sufficient number of preselected questions have been responded to a probable solution is then indicated to the operator. FIG. 1 shows a data sheet 20 having a number of possible conditions existing with the television receiver. On one side of the data sheet there is provided a black field 22 in the form of a coded data strip 24. Here relevant binary information is imprinted in the form of a number of white dots 23. When the entire manual consisting of a large number of data sheets, each containing a number of questions which must be answered, are programmed by means of binary coded information, then the entire manual is reproduced on microfilm. Depending on the size and the nature of the manual to be recorded it is generally convenient to assign one frame of microfilm per manual page. Since there are about 2500 frames to a microfilm spool the amount of information that can thus be contained is substantial.

Figures 7A, 7B, 8:
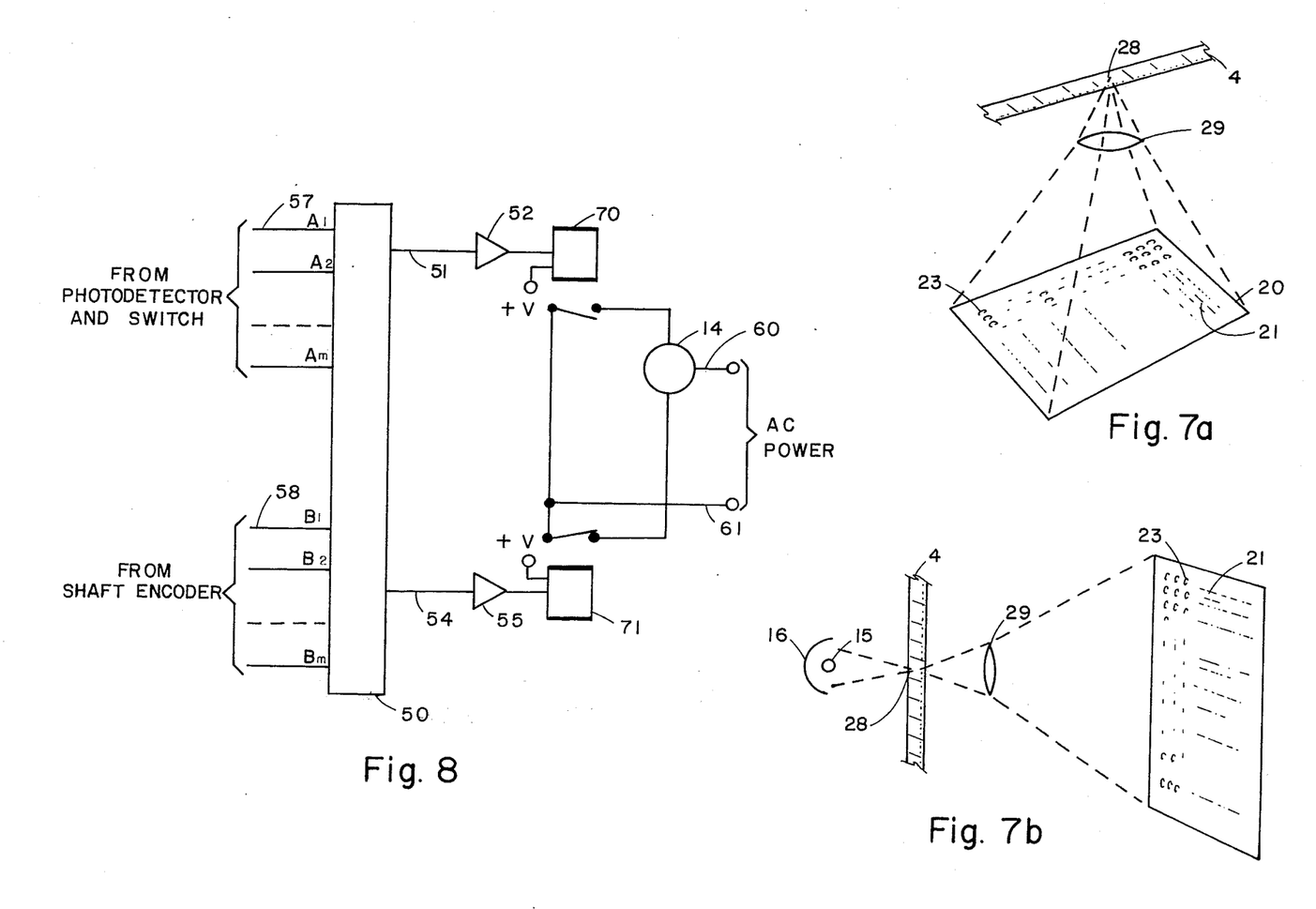
FIG. 7a is a schematic representation of the apparatus for recording information and coded data on microfilm.
FIG. 7b is a schematic representation of the apparatus for projecting the information and coded data on a viewing screen.
FIG. 8 is a schematic representation of the motor drive circuit of FIG. 5.

FIG. 7a shows one method for conveying the information data 21 and the coded data 23 upon a single microfilm frame 28. Here the film 4 is subjected to the information data and coded data by projection through an anamorphic lens 29. The purpose of the anamorphic lens is to compress the coded data in one direction while leaving the information data relatively undisturbed. When the frame 28 is then subjected to a projection system as shown in FIG. 7b where light from a strong projection lamp 15 is directed to the particular frame 28 by means of reflector 16 and directed through a similar anamorphic lens 29 then the information data 21 appears in a nondistorted form upon the viewing screen 2.

Figure 2:
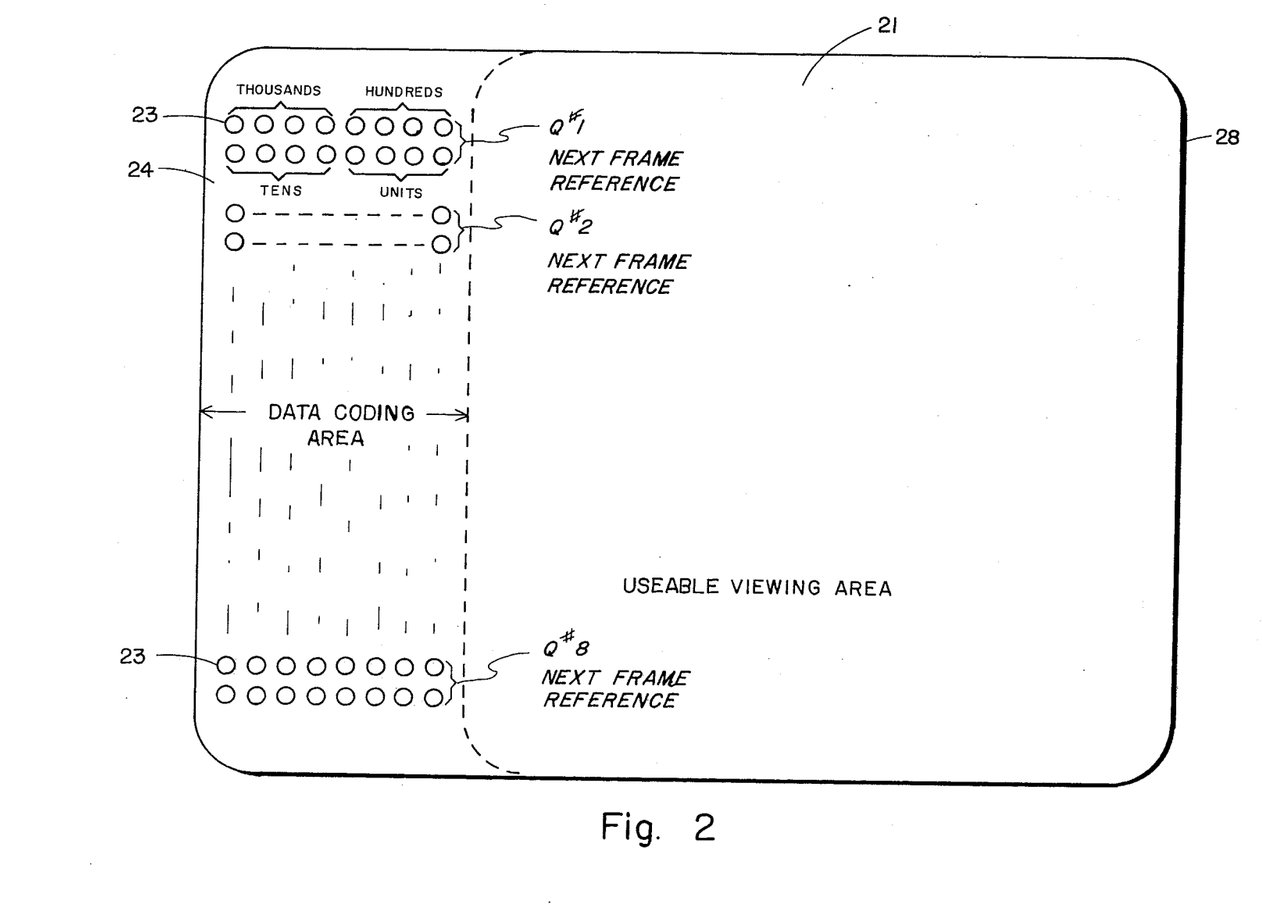
FIG. 2 is a front section of a frame of microfilm with the information of the data sheet of FIG. 1.
Figure 3:
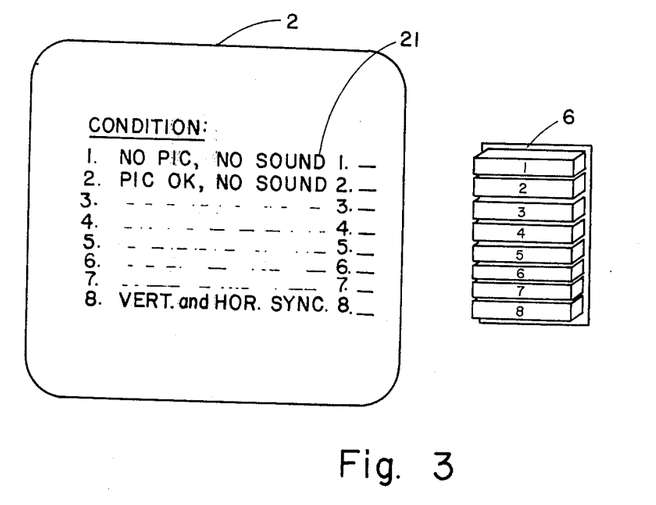
FIG. 3 is a front perspective view of a microfilm viewing screen and response switches.

FIG. 3 shows how the information projected upon the viewing screen 2 of the console 1 is related to the response switches 6. Here the typical questions present within the information contained within frame 28 is presented as a number of conditions that suggest a response. Conditions are listed from 1 to 8 and in this embodiment each question has a corresponding response switch 1 to 8. Here a positive response requires that the button opposite the condition be depressed and if the solicited response is negative then the response switch 6 is left in its normal undepressed state. FIG. 2 in greatly enlarged form shows a typical microfilm frame 28 of standard 16 mm size where the information data is allocated in a first region 21 and the optically encoded data, for example, in the form of white dots 23 is limited to the aforementioned coded data strip 24. This is necessary to insure that while the information data is projected upon the viewing screen 2 the optically encoded data is simultaneously projected upon a photocell matrix 11 which can be seen by referring now to FIG. 5. The photocell matrix 11 consists of an ordered array of photodiodes 25 with a corresponding number of terminals 10. The illumination of the photodiodes 25 by light projected through the region 24 of the frame 28 transfers the opticaly encoded data 23 to the particular photodiodes 25 that optically correspond therewith. The photocell matrix 11 thereby develops a signal that is delivered by means of terminals 10 to a printed circuit 12. The printed circuit consists of a number of diode logic devices such as logic gates 13 that are electrically coupled with the response switches 6. Depression of any of the response switches 6 in response in the affirmative to any of the aforementioned questions pesented upon the viewing screen 2 thereby gates the corresponding gate 13 and determines an output signal from the logic circuit 12 depending upon the particular photodiodes 25, response switches 6 and logic gates 13 that are energized. The output signal from circuit 12 is then directed to the input of the drive motor 14 and this signal by means of shaft encoder 14a determines the number of frames 28 to be advanced upon the takeup reel 17. The output signal from logic circuit 12 is also coupled with the second digital readout indicator 8 in order to show the operator the number of the selected frame that will next be projected upon viewing screen 2.

Figure 6:
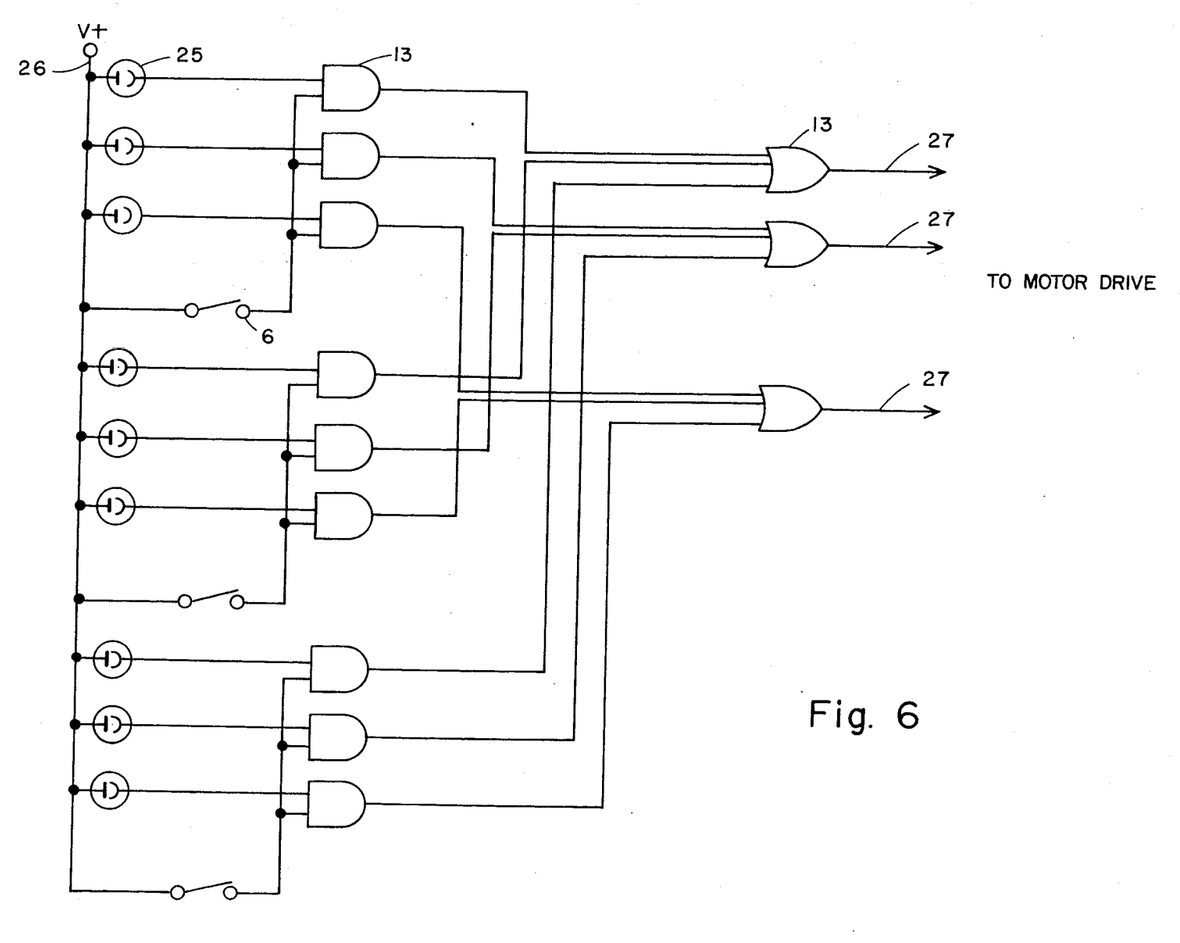
FIG. 6 is a circuit diagram including the photoelectric response switches and logic devices contained within the system of FIG. 5.

FIG. 6 shows a schematic representation of the arrangement existing between the photodiodes 25, the logic gates 13 and the response switches 6. The voltage source for the circuit is connected to terminal 26. Here the output leads 27 are directed to the input leads 34 of the drive motor 14.

FIG. 8 illustrates a typical drive motor arrangement, in which the output of the logic gates 13 that certain the next-frame-information, the result of the cooperative response of the photodiode matrix 11 and the response switches 6 on the front panel, is employed to control the motor 14. The next-frame-information, coded in binary or other modulotwo format is thus compared with the output of the shaft encoder 14a or other means for indicating the presently viewed frame member. A magnitude comparator 50, a commercially available micrologic package (reference type SN7485) having a series of data input terminals 57 containing ($A_r$-$A_m$) inputs connected to each output from the photodetectors and switches (6, 25) and a series of data input terminals 58 containing ($B_r$-$B_m$) inputs connected to each output from the shaft encoder 14a controls the motor 14 direction as follows. The motor 14 is connected by terminals 60, 61 to a source of AC power (not shown) so that the direction of the motor 14 can be controlled by means of the comparator 50. Signal from the "more-than" output 51 will cause the subsequent operation of the forward control relay 70 by means of driver amp. 52 causing the forward motor drive contacts to be operated, thus causing the film 4 to be advanced. Likewise, a signal from the "less-than" output 54 will cause the motor reverse relay 71 to operate by means of drive amp. 55 thus reducing the frame count by running the film 4 backwards. Upon reaching the selected frame, when the binary count of the photodetectors 25 equals the binary count of the shaft encoder 14a, that is, neither less than nor more than the other, then both relays 70, 71 shut off, and the motor 14 will stop upon the selected frame. The circuit elements of FIG. 8 are included in the circuit 12 of FIG. 5.

Figure 9:
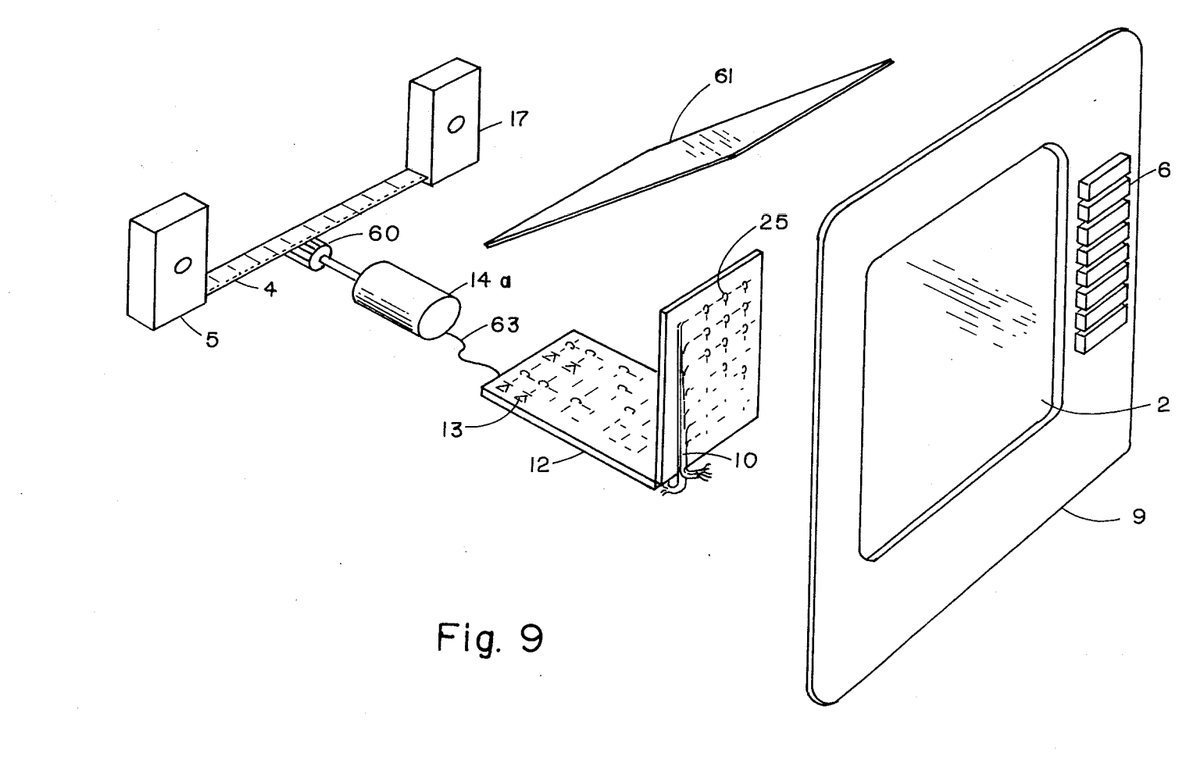
FIG. 9 is an alternate embodiment of the microfilm system of FIG. 4.

FIG. 9 shows an alternate embodiment of the microfilm instruction system of this invention employing a sprocket drive 60 to advance the film 4, in response to shaft encoder 14a. Here shaft encoder 14a is connected to the aforementioned circuit board 12 by means of lead 63. Also included in the system is mirror 61 which provides improved optical definition when used in combination with the projection lamp 15, reflector 16 and lens 29 shown in FIG. 5.

A further application of the inventive microfilm system is in the educational field where the student under the open classroom concept, for example, work at his own rate of progress. Here the educational program for each grade level and for a variety of individul subjects are recorded on microfilm in the form of a progression of multiple choice examination questions. The encoded program relating to the information data in the form of multiple choice questions would inform the student as to what his strong points are and also what areas require further study and review, the contents of which can be on the microfilm record. The student would view the representative multiple choice questions presented upon the viewing screen an would respond by depressing the appropriate response switch for an affirmative answer and leaving the appropriate response switch in an undepressed state for a negative reply. The aforementioned relationship between the electro-optical circuit, the opticaly encoded program and the gating responses provided by the response switches then would automaticaly select the next appropriate frame based on the students response. This frame, for example, would indicate a series of new books and subjects which the student is capable of attempting, and within the same frame, project a number of books for reviewing on the basis of the overall responses. Alternatively, the next frame or succession of frame may contain said review material with detailed instruction to fortify the areas in which the said microfilm examination questions did indicate said deficiency.

Figure 5:
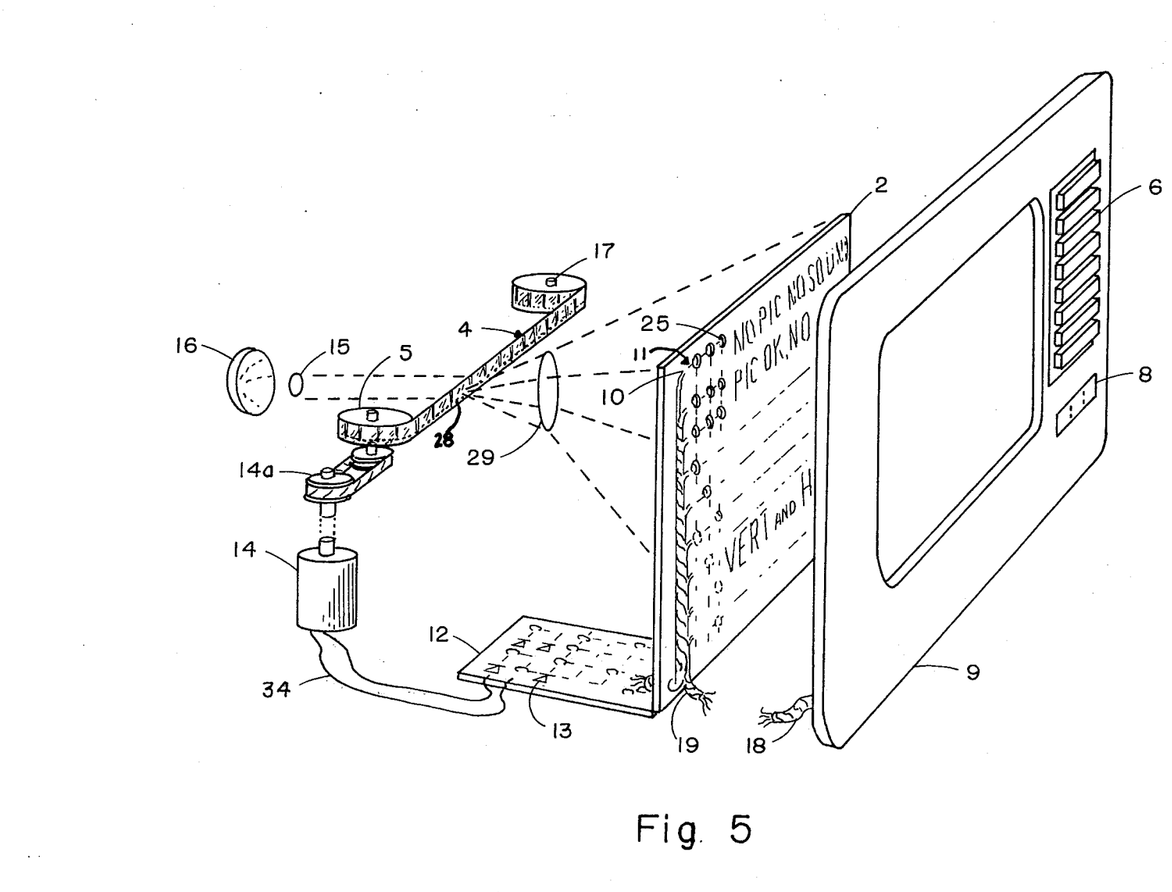
FIG. 5 is an exploded side perspective view of the microfilm system of FIG. 4.

A simplified embodiment of this invention utilizes the system of FIG. 5 without employing the optically encoded data 23 of FIG. 1 or the photodiode array 11 of FIG. 9. The shaft encoder 14a and magnitude comparator 50 are also not required when a step motor is substituted for regular induction motor 14. Here when the opertor depresses particular switches 6 in response to particular questions displayed upon screen 2 the step type drive motor (not shown) in place of induction motor 14 is arranged to advance the film 4 a preselected number of frames depending upon the particular switch depressed. Here the microfilm frame is advanced and displayed without the use of optically encoding the microfilm as described earlier. This embodiment finds applicaton as an inexpensive and less complicated model for limited useage.

Although the application for the inventive photographic instructional display system has been directed to troubleshooting for repair purposes and for quizzing students and indicating the students strong and weak scholastic areas the invention finds application in a wide variety of diagnostic and tutorial fields such as medicine, science and law. The embodiments herein presented are by way of example only and are not intended to limit the scope of this invention in any possible manner.

What is claimed is:
1. A photographic instruction display system comprising:
    a photographic film having N frames, where N is an integer greater than one, each of said N frames containing a plurality of information data and a plurality of optically encoded data each related to a different one of said pluraity of information data, each of said plurality of information data being associated with a different sequence of M frames dispersed throughout said N frames, where M is an integer greater than one but less than N, each of said sequence of M frames providing a different logical sequence of said plurality of informaiton data in the form of questions;
    first means for projecting said plurality of information data upon a viewing screen;
    second means for projecting said plurality of encoded data upon a matrix of photo responsive means;
    a plurality of third means each associated with a different one of said plurality of information data in each of said N frames; and
    fourth means coupled to said second means and said plurality of third means responsive to actuation of at least one of said plurality of third means by an operator to indicate his answer to one of said questions in one of said N frames and that one of said projected plurality of encoded data associated with said one of said question to advance said photographic film to the next succeeding frame of one of the associated one of said sequence of M frames as directed by said associatecd projected plurality of encoded data.

2. The photographic instruction display system of claim 1 wherein said plurality of encoded data comprising a plurality of binary coded data points having light transparency.

3. The photographic instruction display system of claim 1 wherein said first and second means for projecting said informaton and said encoded data comprises a projection lamp for generating and transmitting light through said film for simultaneously projecting both said information data and said binary coded data.

4. The photographic instruction display system of claim 1 wherein said photo responsive means comprises a plurality of photodiodes arranged in a matrix array for receiving light energy containing said optically encoded data from each of said N frames.

5. The photographic instruction display system of claim 4 wherein said third means comprises a plurality of normally open switches electrically coupled with a plurality of logic gates included in said fouth means, said switches electrically gating said logic gates when said switches are actuated.

6. The photographic instruction display system of claim 5 wherein said fourth means includes a photographic film cassette and drive means, and wherein said photodiode array upon receiving light energy through a first series of opticaly encoded data points provides a first input signal to said plurality of logic gates, and actuation of one of said switches provides electrical energy to a first plurality of said logic gates to produce a first output signal from said logic gates, said output signal operating said motor drive and said cassette to advance said film to said next succeeding frame of one of the associated one of said sequence of M frames.

7. The photographic instruction display system of claim 6 wherein said first output signal energizes a first digital readout means to display a number corresponding to said next succeeding frame of one of the associated one of said sequence of M frames.

8. The photographic instruction display system of claim 7 further including a second digital readout means to display a number corresonding to that one of said N frames presently projected on said viewing screen.

* * * * *